DEFENSIVE PUBLICATION

UNITED STATES PATENT AND TRADEMARK OFFICE

Published at the request of the applicant or owner in accordance with the Notice of Dec. 16, 1969, 869 O.G. 687. The abstracts of Defensive Publication applications are identified by distinctly numbered series and are arranged chronologically. The heading of each abstract indicates the number of pages of specification, including claims and sheets of drawings contained in the application as originally filed. The files of these applications are available to the public for inspection and reproduction may be purchased for 30 cents a sheet.

Defensive Publication applications have not been examined as to the merits of alleged invention. The Patent and Trademark Office makes no assertion as to the novelty of the disclosed subject matter.

PUBLISHED MARCH 2, 1976

944 O.G. 40

T944,001

AUTOMATED SYSTEM AND METHOD FOR PARTITIONING AND MAPPING CIRCUIT UNITS ONTO MODULES INCLUDING AN ITERATIVE PROCESS

Maurice Hanan, Ossining, and Peter Karl Wolff, Sr., Shrub Oak, N.Y., assignors to International Business Machines Corporation, Armonk, N.Y.

Continuation of application Ser. No. 479,069, June 13, 1974. This application Sept. 23, 1974, Ser. No. 508,471

Int. Cl. G06f *9/12*

U.S. Cl. 444—1

10 Sheets Drawing. 11 Pages Specification

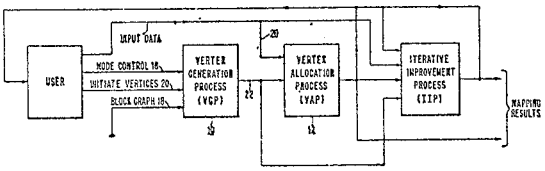

An iterative process, embodied as a computer algorithm, is provided for partitioning and mapping logic circuits onto chips. The process can be advantageously used in the field of design automation for large scale integrated circuit technology. The process begins with a given partition, or partial partition, wherein not all circuits have been allocated. A set of circuits is removed from one or more chips and the set of circuits is re-allocated. The process is specified by two rules, the rule for removing the circuits and the rule for re-allocating the circuits, and two versions of the removal rule, the multiple method and the single method are described. By employing the process of the present invention, the number of blocks (i.e., circuit units) on a module (chip) may be reduced, the number of connection pins over all the modules and maximum number of pins on any modules may be reduced, and the number of modules may be reduced.

AUTOMATED SYSTEM AND METHOD FOR PARTITIONING AND MAPPING CIRCUIT UNITS ONTO MODULES INCLUDING AN ITERATIVE PROCESS

Original Filed Sept. 23, 1974

Figure 1:
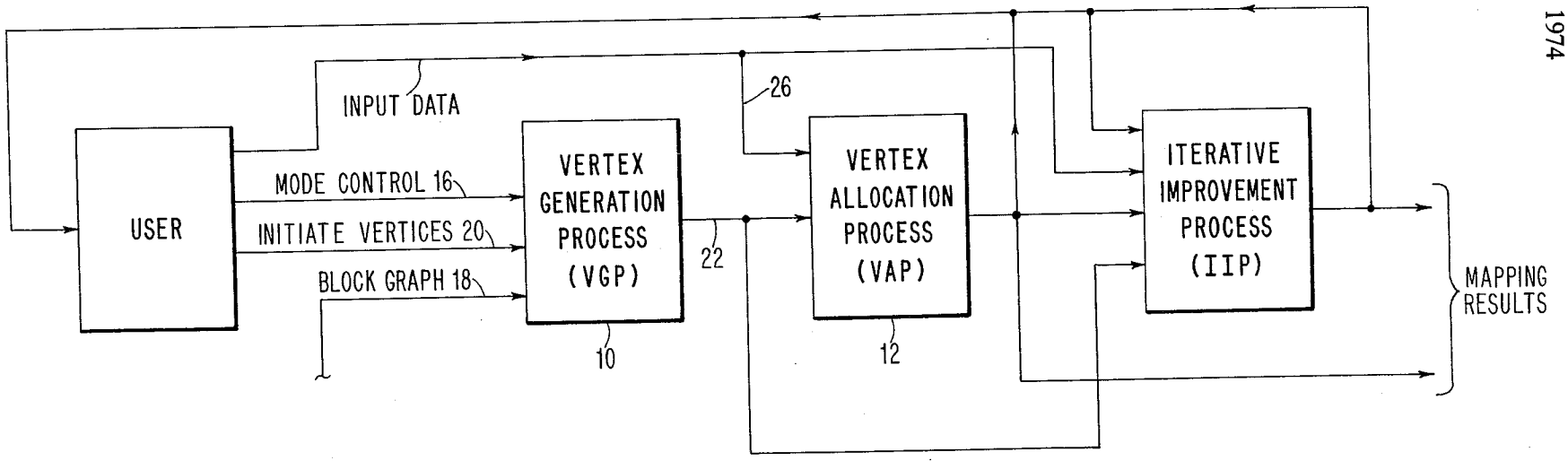
Figure 2A:
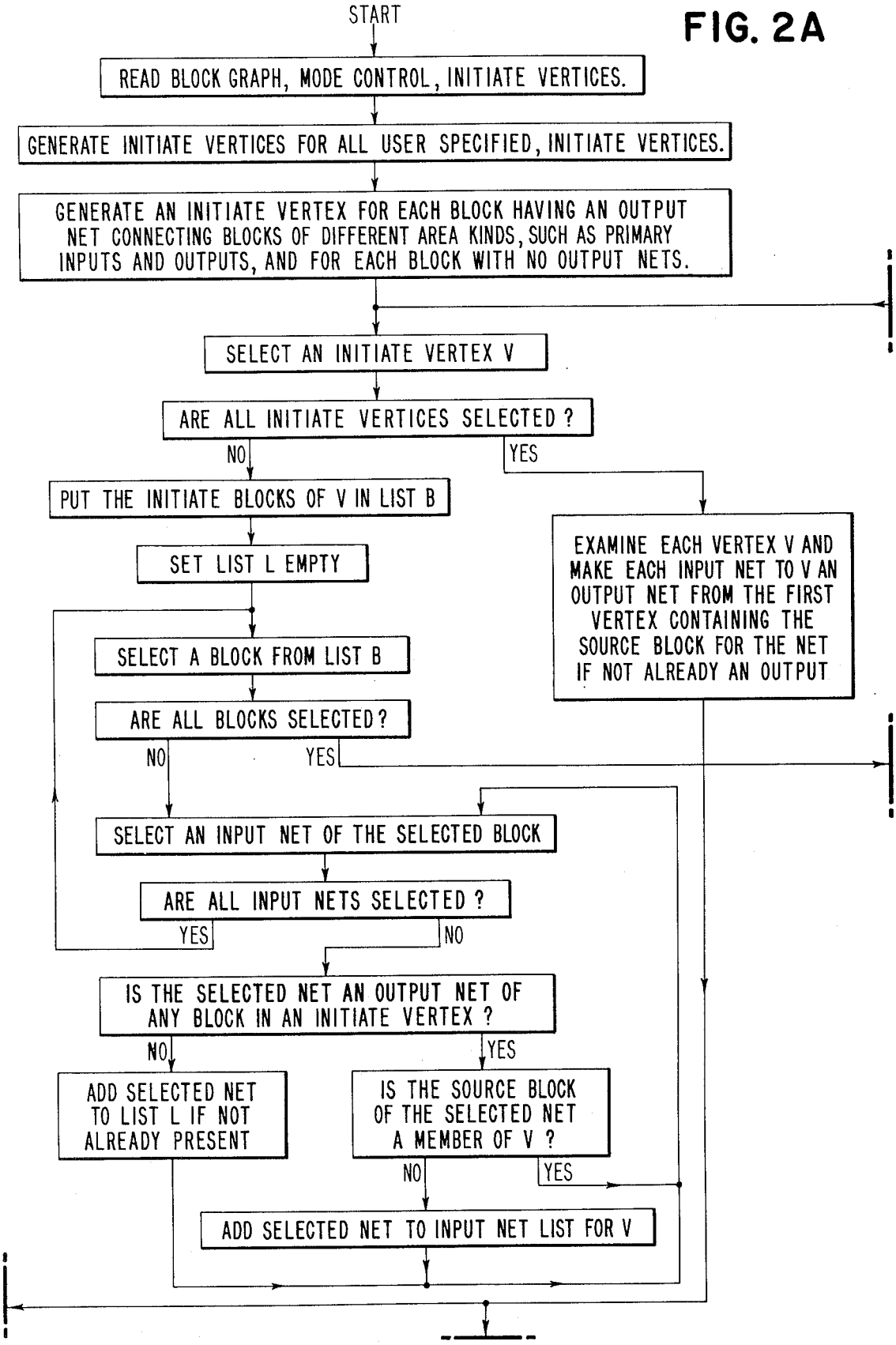
Figure 2B:
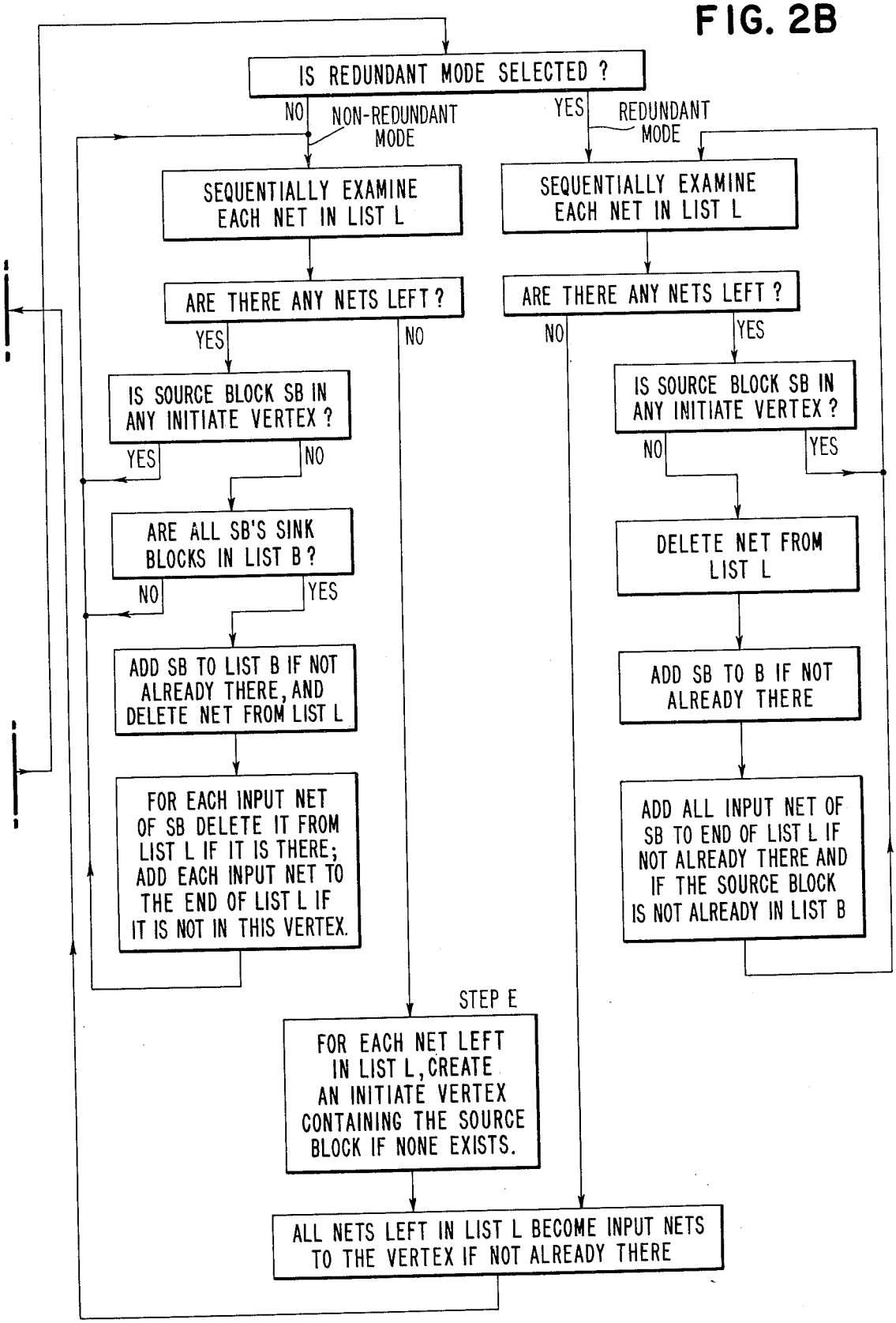
Figure 2D:
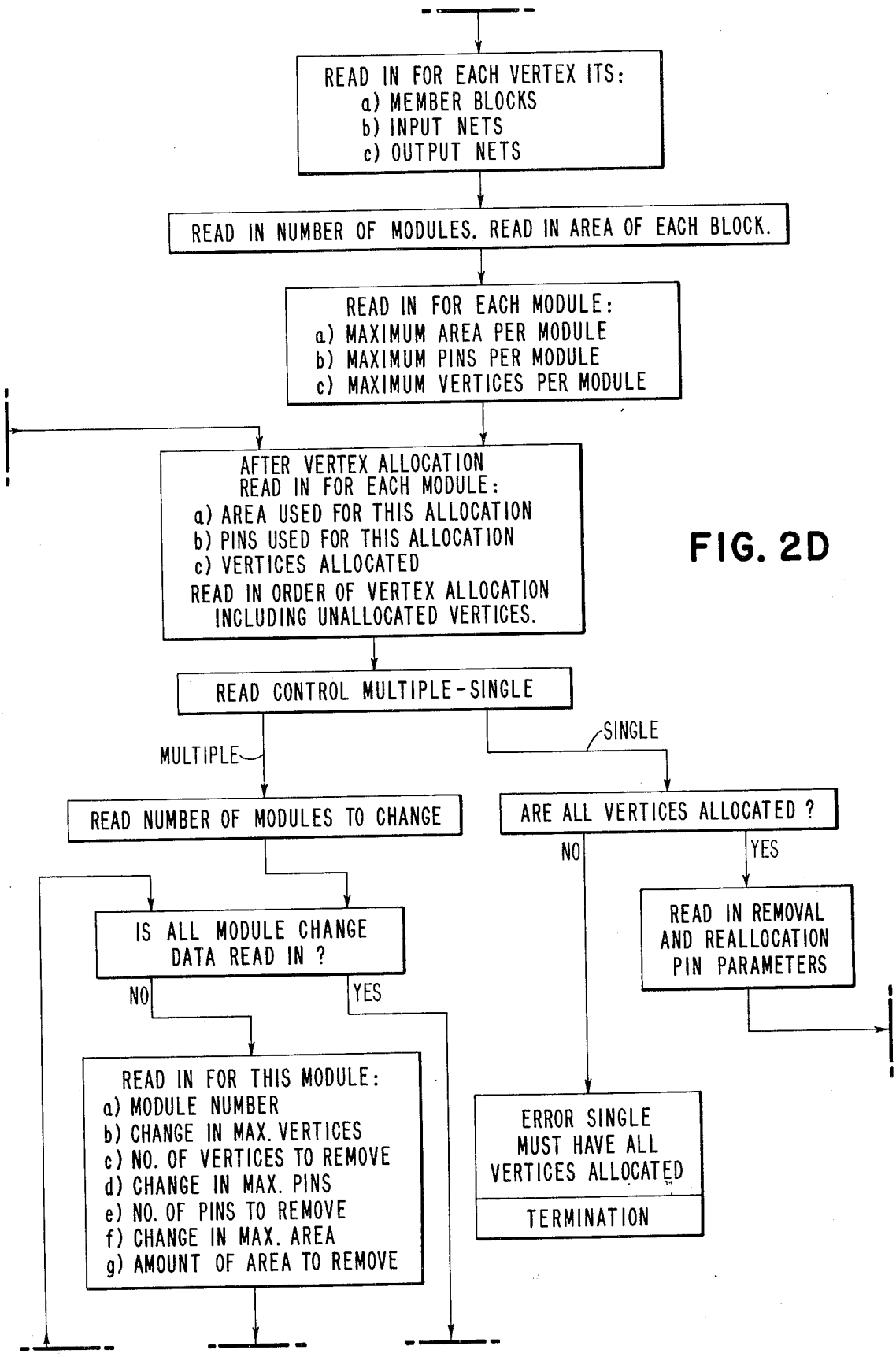
Figure 2E:
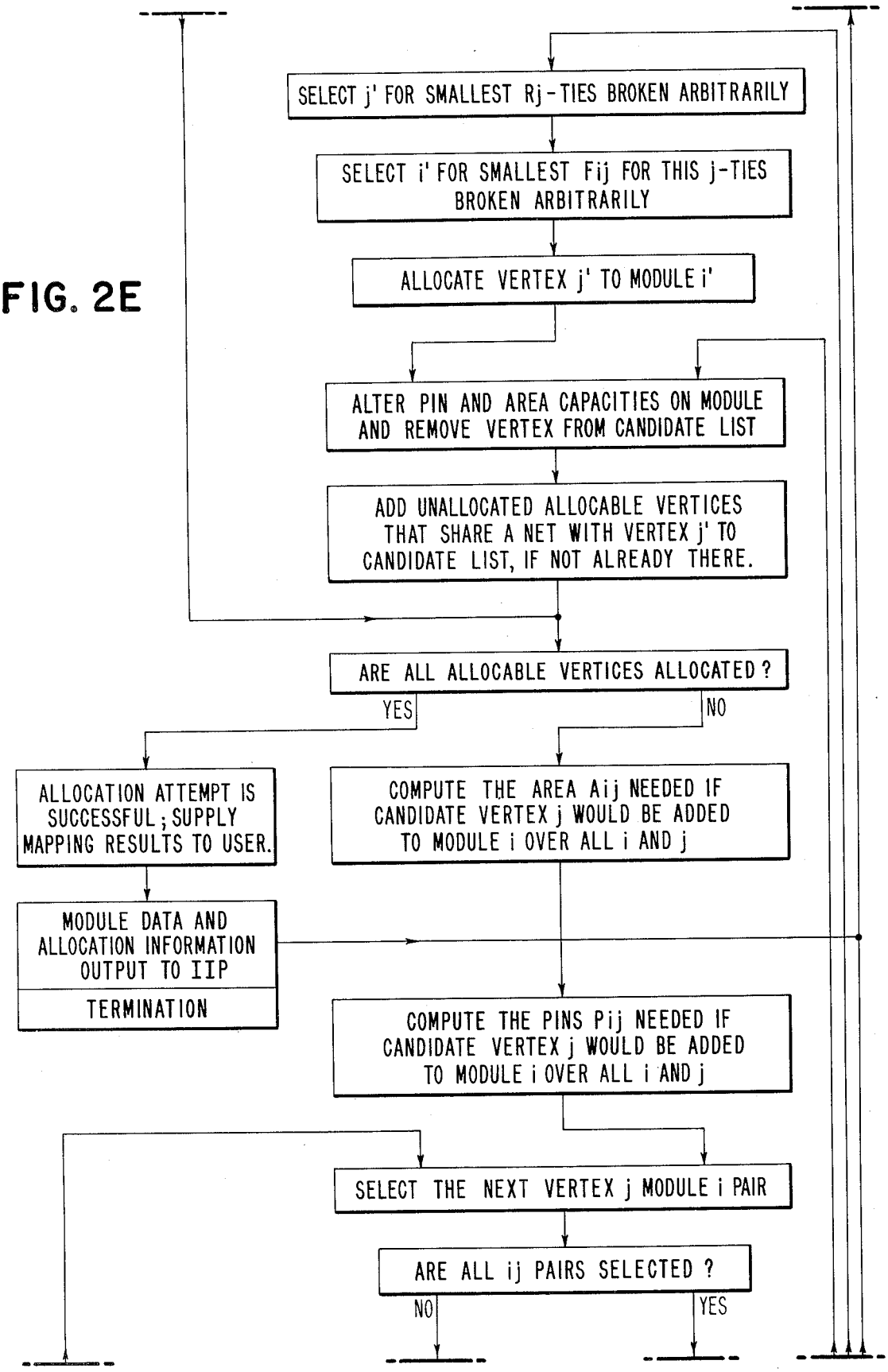
Figure 2F:
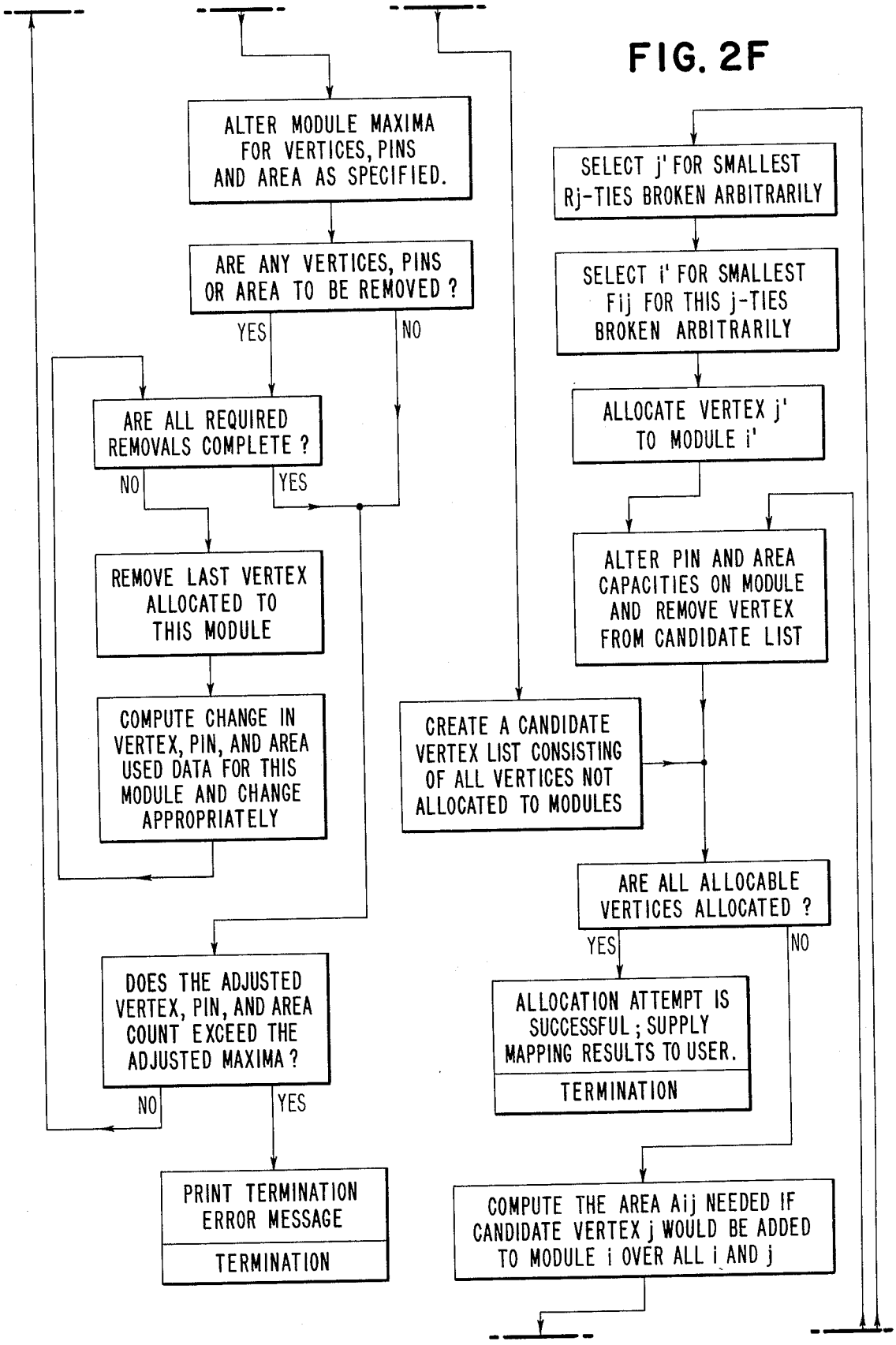
Figure 2G:
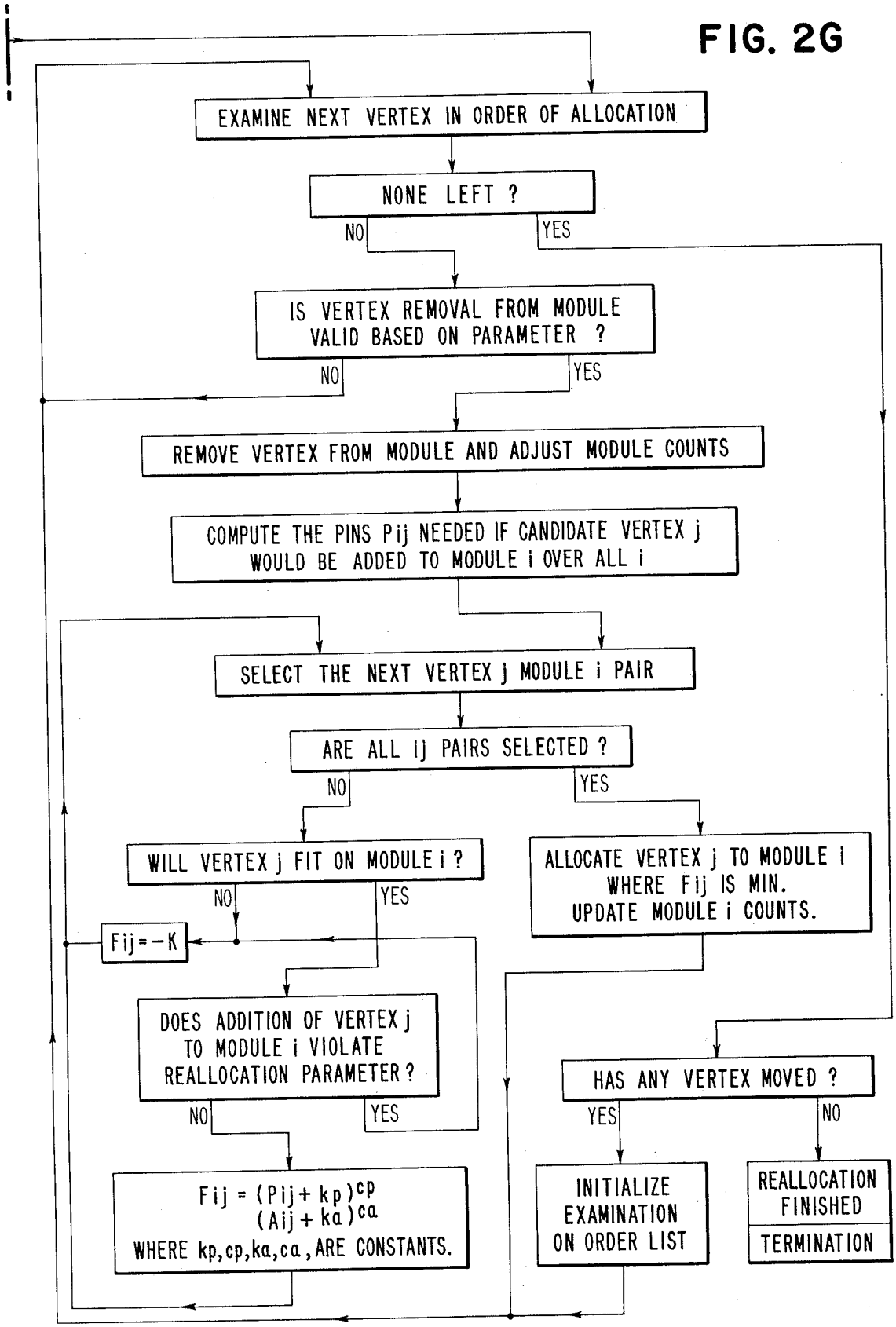
Figure 2H:
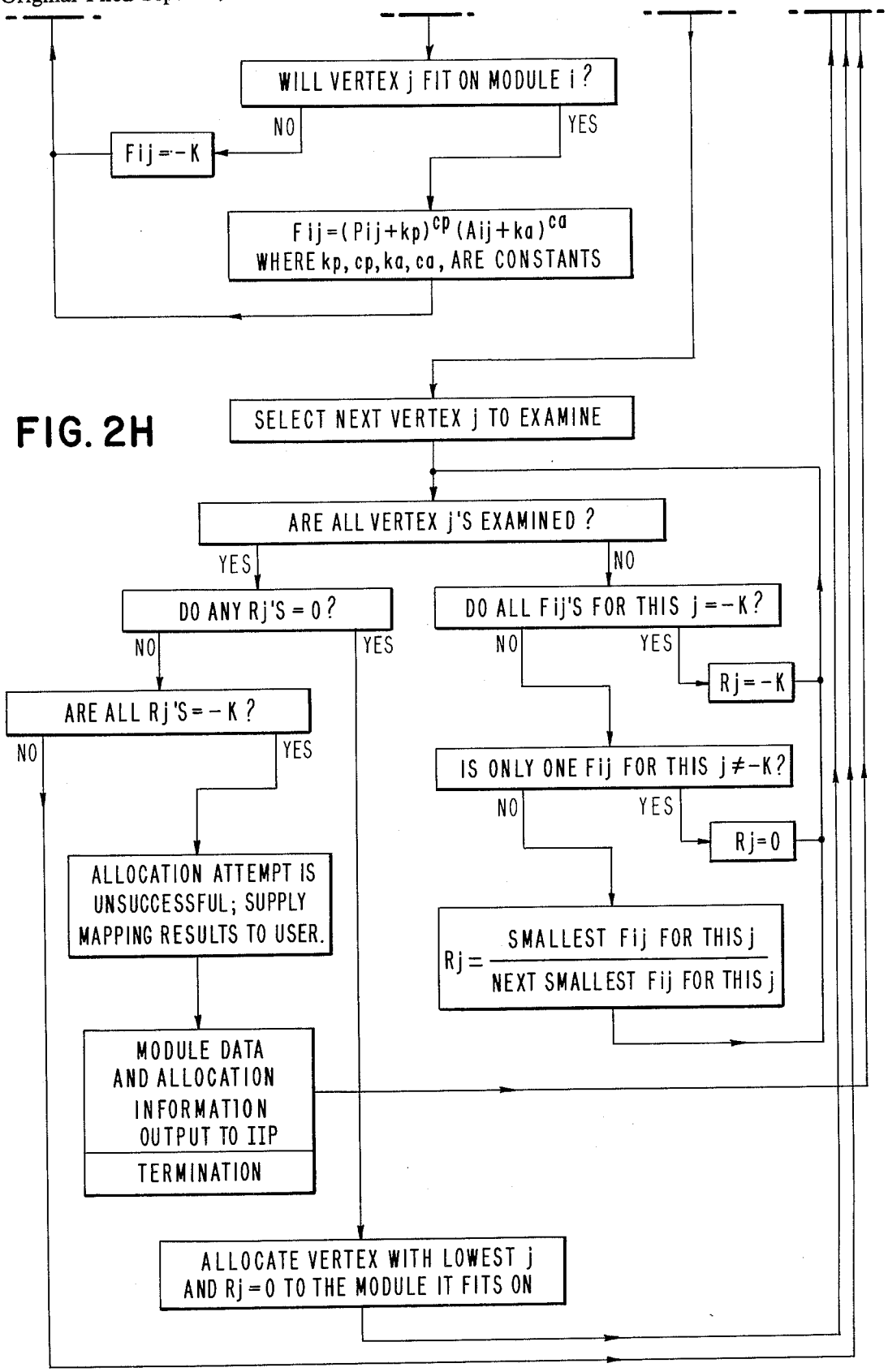
Figure 2I:
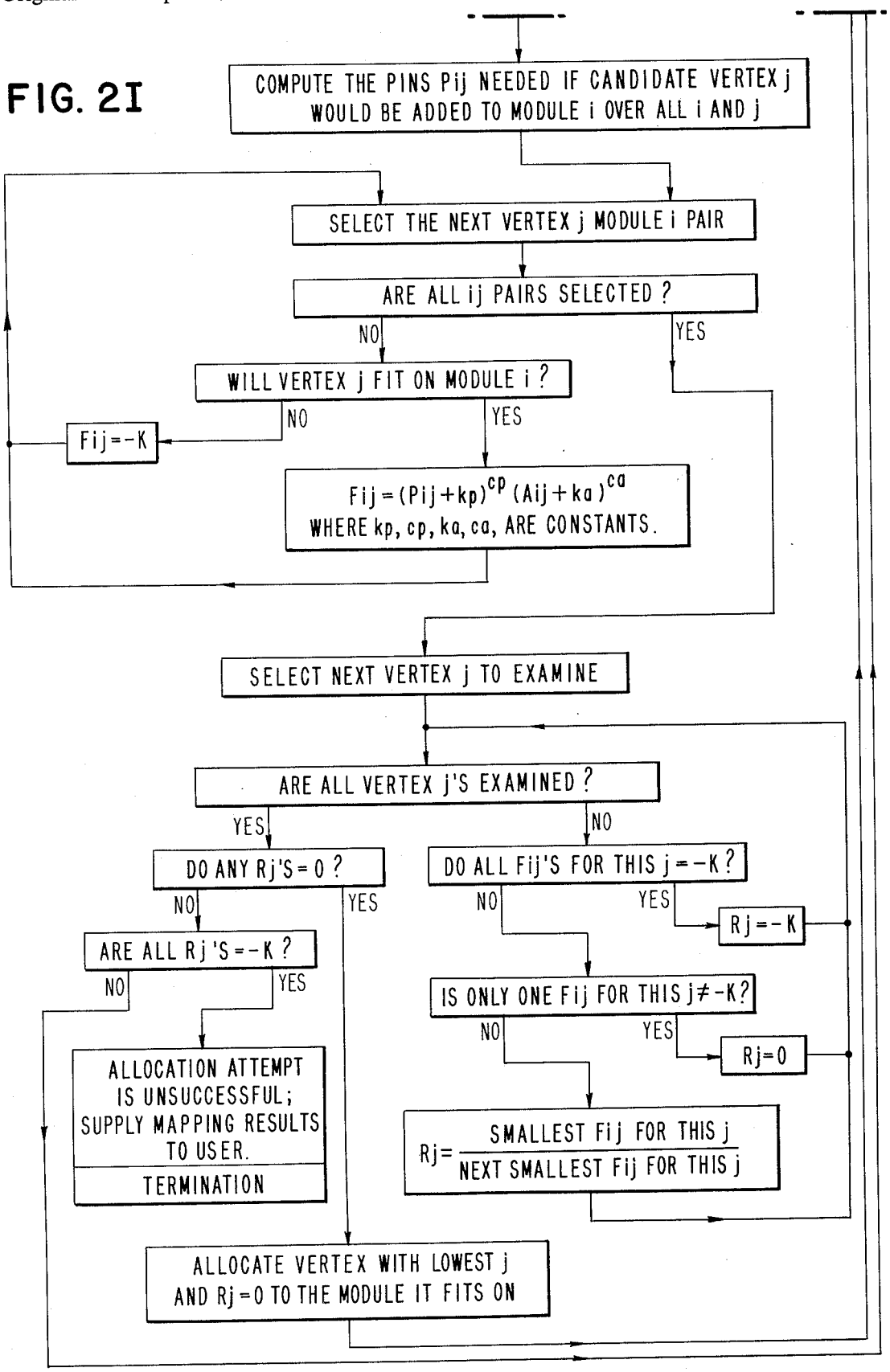

FIG. 2
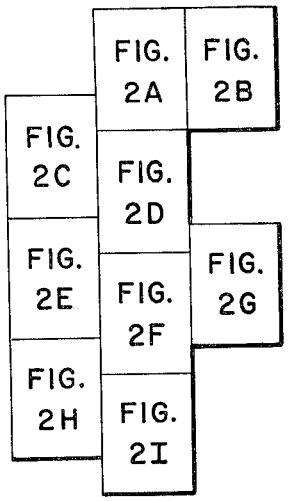
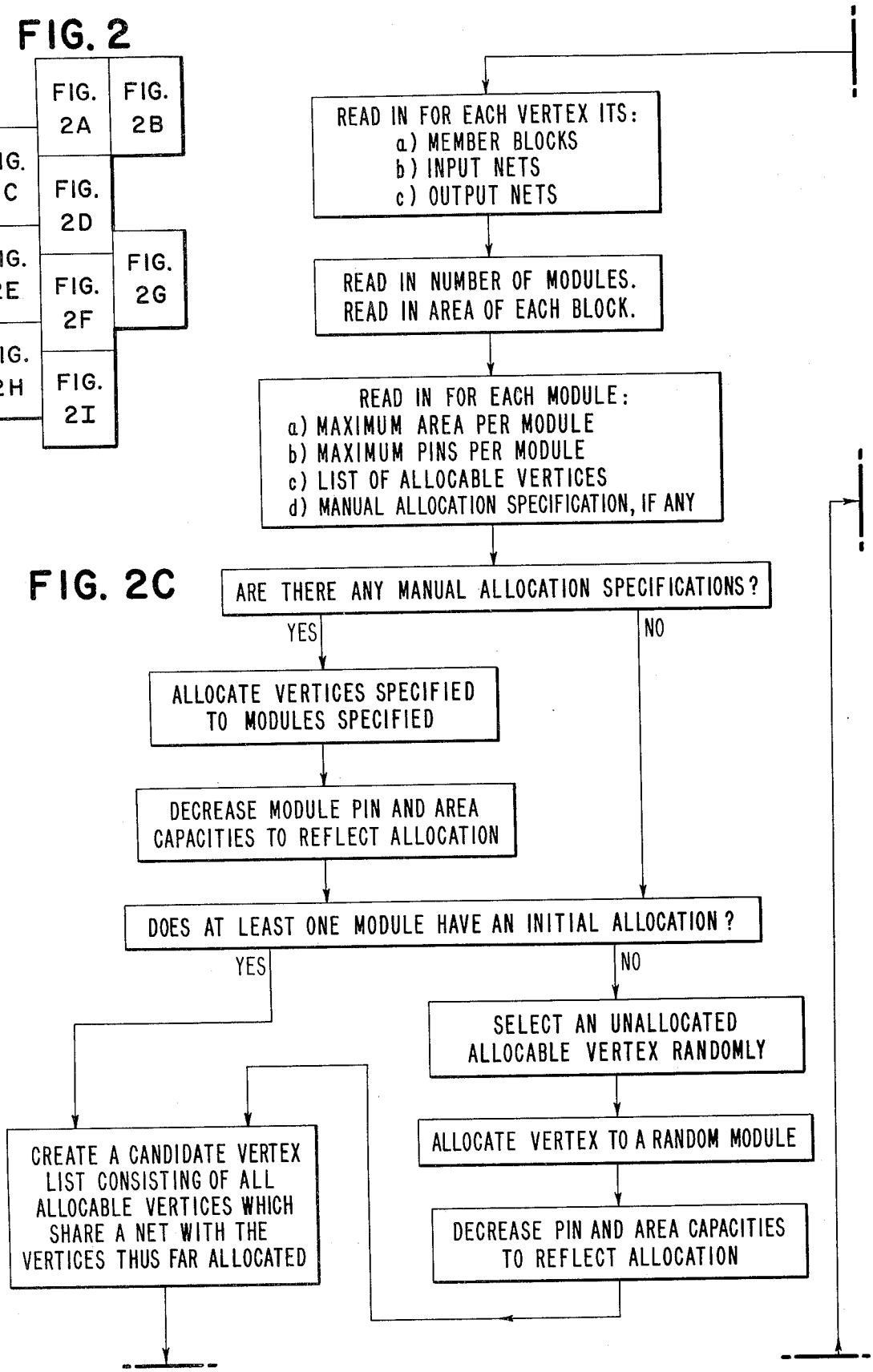
FIG. 2C